United States Patent
Huang et al.

(10) Patent No.: US 10,180,482 B2
(45) Date of Patent: Jan. 15, 2019

(54) CHANNEL BY CHANNEL ARTIFACT REDUCTION IN PARALLEL MRI

(71) Applicant: KONINKLIJKE PHILIPS N.V., Eindhoven (NL)

(72) Inventors: Feng Huang, Gainesville, FL (US); Wei Lin, Gainesville, FL (US)

(73) Assignee: KONINKLIJKE PHILIPS N.V., Eindhoven (NL)

(*) Notice: Subject to any disclaimer, the term of this patent is extended or adjusted under 35 U.S.C. 154(b) by 912 days.

(21) Appl. No.: 14/405,321

(22) PCT Filed: Jun. 3, 2013

(86) PCT No.: PCT/IB2013/054558
§ 371 (c)(1),
(2) Date: Dec. 3, 2014

(87) PCT Pub. No.: WO2013/182967
PCT Pub. Date: Dec. 12, 2013

(65) Prior Publication Data
US 2015/0115963 A1    Apr. 30, 2015

Related U.S. Application Data

(60) Provisional application No. 61/655,572, filed on Jun. 5, 2012.

(51) Int. Cl.
*G01R 33/565* (2006.01)
*G01R 33/385* (2006.01)
(Continued)

(52) U.S. Cl.
CPC ......... *G01R 33/565* (2013.01); *G01R 33/283* (2013.01); *G01R 33/385* (2013.01);
(Continued)

(58) Field of Classification Search
CPC .. G01R 33/283; G01R 33/385; G01R 33/543; G01R 33/565; G01R 33/5611; G01R 33/56509
See application file for complete search history.

(56) References Cited

U.S. PATENT DOCUMENTS

| 7,626,388 B2 | 12/2009 | Taniguchi et al. |
| 7,688,068 B2 | 3/2010 | Beatty |

(Continued)

FOREIGN PATENT DOCUMENTS

| JP | 2001325583 A | 11/2001 |
| WO | 2011116785 A1 | 9/2011 |

OTHER PUBLICATIONS

Huang et al "Advantages of Channel by Channel Artifact Detection and Correction" Proc. Intl. Soc. Mag. Reson. Med. 20 (2012) p. 3434.

(Continued)

*Primary Examiner* — Dixomara Vargas (57) ABSTRACT

An imaging system (5) includes a plurality of coil channel receivers (26) and one or more processors or modules (38). The plurality of coil channel receivers (26) demodulate magnetic resonance data from a multi-channel coil (10) which includes a plurality of coil elements (16) spatially separated, each element transmitting magnetic resonance data on a corresponding channel (25). The one or more processors or modules (38) are configured to detect (26) artifacts in the magnetic resonance data on each channel individually. The one or more processors or modules (38) are further configured to select (27) the magnetic resonance data from the channels which include detected artifacts at or below a threshold artifact level and reconstruct (32) one or more images using the selected magnetic resonance data.

20 Claims, 5 Drawing Sheets

(51) Int. Cl.
*G01R 33/561* (2006.01)
*G01R 33/54* (2006.01)
*G01R 33/28* (2006.01)

(52) U.S. Cl.
CPC ........ *G01R 33/543* (2013.01); *G01R 33/5611* (2013.01); *G01R 33/56509* (2013.01)

(56) References Cited

U.S. PATENT DOCUMENTS

| | | | | |
|---|---|---|---|---|
| 8,711,144 | B2* | 4/2014 | Johnson | G06T 7/0002 345/419 |
| 2002/0181753 | A1 | 12/2002 | Ma | |
| 2008/0129732 | A1* | 6/2008 | Johnson | G06T 7/0002 345/424 |
| 2015/0002149 | A1* | 1/2015 | Nehrke | G01R 33/243 324/309 |

OTHER PUBLICATIONS

Henningsson, Markus et al "Prospective Respiratory Motion Correction for Coronary MR Angiography using a 2D Image Navigator", Magnetic Resonance in Medicine, vol. 69, 2013, pp. 486-494.
Sachs, Todd S. et al "Real-Time Motion Detection in Spiral MRI using Navigators", Magnetic Resonance in Medicine, vol. 33, 1994, pp. 639-645.
Winkelmann, Richard et al "Ghost Artifact Removal using a Parallel Imaging Approach", Magnetic Resonance in Medicine, vol. 54, 2005, pp. 1002-1009.
Vasanawala, Shreyas S. et al "Navigated Abdominal T1-W MRI Permits Free-Breathing Image Acquisition with Less Motion Artifact", Pediatric Radiology, vol. 40, 2010, pp. 340-344.
Lustig, Michael et al "Sparse MRI: The Application of Compressed Sensing for Rapid MR Imaging", Magnetic Resonance in Medicine, vol. 58, 2007, pp. 1182-1195.
Huang, Feng et al "Data Convolution and Combination Operation (COCOA) for Motion Ghost Artifacts Reduction", Magnetic Resonance in Medicine, vol. 64, 2010, pp. 157-166.
Samsonov, Alexey A. et al "Pocs-Enhanced Correction of Motion Artifacts in Parallel MRI", Magnetic Resonance in Medicine, vol. 63, 2010, pp. 1104-1110.
Bydder, M. et al "Detection and Elimination of Motion Artifacts by Regeneration of k-Space" Magnetic Resonance in Medicine, vol. 47, 2002, pp. 677-686.
Fu ZW, Wang Y, Grimm RC, Rossman PJ, Felmlee JP, Riederer SJ, Ehman RL. "Orbital navigator echoes for motion measurements in magnetic resonance imaging" Magn Reson Med 1995;34:746-753.
Kadah YM, Abaza AA, Fahmy AS, Youssef AM, Heberlein K, Hu XP. "Floating navigator echo (FNAV) for in-plane 2D translational motion estimation". Magn Reson Med 2004;51:403-407.
Lin W, Huang F, Li Y, Saylor C, Reykowski A. 'Motion Compensation with Floating Navigator and GRAPPA Operators Magnetic Resonance in Medicine 63: p. 339-348 (2010).
Bydder M, Atkinson D, Larkman DJ, Hill DLG, Hajnal JV. "SMASH Navigators" Magn Reson Med 2003;49:493-500.
Fautz HP, Honal M, Saueressig U, Schafer O, Kannengiesser SAR. "Artifact Reduction in Moving-Table Acquisitions Using Parallel Imaging and Multiple Averages" Magn Reson Med 2007;57:226-232.

* cited by examiner

CHANNEL BY CHANNEL ARTIFACT REDUCTION IN PARALLEL MRI

CROSS-REFERENCE TO PRIOR APPLICATIONS

This application is the U.S. National Phase application under 35 U.S.C. § 371 of International Application No. PCT/IB2013/054558, filed on Jun. 3, 2013, which claims the benefit of U.S. Provisional Patent Application No. 61/655,572, filed on Jun. 5, 2012. These applications are hereby incorporated by reference herein.

The following relates generally to medical imaging. It finds particular application in conjunction with magnetic resonance imaging and image artifact correction, and will be described with particular reference thereto. However, it will be understood that it also finds application in other usage scenarios and is not necessarily limited to the aforementioned application.

In a magnetic resonance imaging sequence, magnetic resonance is excited in the tissue of a subject. A coil, either a whole body coil and/or a local coil such as a cardiac coil, spine coil, and the like, receive weak radio frequency (RF) signals as the excited magnetic resonance decays. The weak RF signals induce current in the coils which form magnetic resonance imaging data. The whole body and/or local coil are disposed about the surface of the subject and can include multiple coil elements. The coil elements are distributed about the coil and are spatially localized. The spatial differences of the coil elements are reflected in the magnetic resonance data. The coil elements collect and transmit data in parallel channels which provide faster imaging. Each coil element typically is represented by one channel and can operate independent of and concurrent to the other coil elements and channels.

Multi-channel coils are widely available. Magnetic resonance (MR) data from coil elements of a multi-channel coil are typically transmitted on parallel channels to corresponding radio frequency receivers for demodulation. The MR data for all coil elements or channels is loaded into a buffer. The same filtering, rejection of motion artifacted data, etc., is performed on all of the channels.

MR data can contain artifacts. Artifacts can occur in imaging from a variety of sources such as hardware sources and subject movement. Movement can include whole body motion, local motion, breathing, pulsation, flow, cardiac, and the like. A variety of techniques are used to detect artifacts using the acquired MR data. For example, a MR navigator sequence, motion monitors, ECG signals, and the like can be used to detect motion and/or algorithms used to determine inconsistencies in the imaging data. Examples of algorithms to determine inconsistencies include COnvolution and Combination OperAtion (COCOA). When artifacts are detected, the imaging data on all channels is discarded which often includes rerunning an imaging sequence or portions of the sequence. The MR data can be processed or filtered to reduce artifacts, but artifacts remain.

Motion is detected in the MR data as a whole. Some motion is localized. Localized motion may not be robustly represented in the data such that algorithms or navigators may not be sensitive to detecting the motion. For example, when using a c-spine coil, swallowing may only be represented in 3 of 16 channels. When motion occurs, the motion artifacts may not be present in some channels due to lower sensitivity of corresponding coil elements to localized motion.

Another source of artifacts which occurs for multi-channel coils includes spikes. Spikes can occur from problems in the coil hardware or unknown sources, but undetected can result in artifacts present in the reconstructed images. Undetected artifacts lead to a lower noise to signal ratio in the MR data used for reconstructing images. The imaging algorithms treat all coil elements and received MR data equally.

The following discloses a new and improved channel by channel artifact reduction which addresses the above referenced issues, and others.

In accordance with one aspect, an imaging system includes a plurality of coil channel receivers and one or more processors or modules. The plurality of coil channel receivers demodulate magnetic resonance data from a multi-channel coil which includes a plurality of coil elements spatially separated, each element transmitting magnetic resonance data on a corresponding channel. The one or more processors or modules are configured to detect artifacts in the magnetic resonance data on each channel. The one or more processors or modules are further configured to select the magnetic resonance data from the channels which include detected artifacts at or below a threshold artifact level and reconstruct one or more images using the selected magnetic resonance data.

In accordance with another aspect, a method of imaging includes demodulating magnetic resonance data on each channel of a plurality of coil channel receivers. Artifacts are detected in the demodulated magnetic resonance data on each channel. The magnetic resonance data is selected from the channels which include detected artifacts at below a threshold artifact level. One or more images are reconstructed from the selected magnetic resonance data.

In accordance with another aspect, an imaging system includes one or more processors configured to detect artifacts in the magnetic resonance data on each of a plurality of channels, each channel of data spatially localized. The one or more processors are further configured to select the magnetic resonance data from each channel, rejecting channels which include detected artifacts and reconstruct one or more images using selected magnetic resonance data.

One advantage is lower residual artifacts.

Another advantage is improved motion compensation.

Another advantage is improved correction of k-space data corruption due to spikes or other signal sources.

Another advantage resides in higher signal to noise ratio.

Another advantage resides in fewer rejections of MR data and/or rerunning of imaging sequences.

Another advantage includes improved throughput with selected channels.

Another advantage includes coil hardware problem isolation.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

Figure 1:
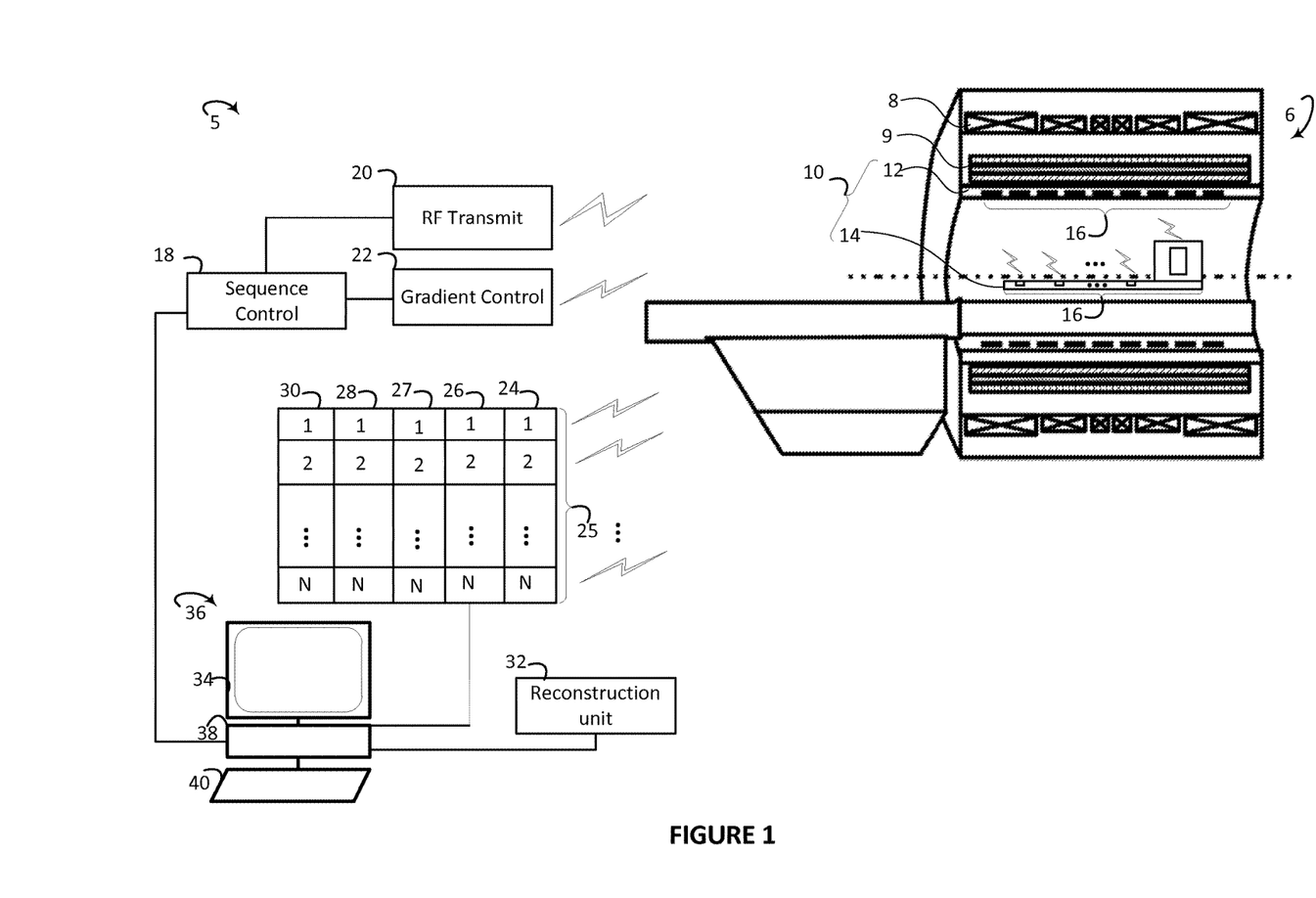
FIG. 1 diagrammatically illustrates an embodiment of channel by channel artifact reduction system.

With reference to FIG. 1, an embodiment of channel by channel artifact reduction system 5 is schematically illustrated. In multi-coil imaging, each of the coils has a different sensitivity to motion and other artifacts. The system 5 includes a multi-channel source of MR data such as a magnetic resonance scanner 6. The scanner includes a main magnet 8 which generates a static magnetic field. The scanner includes one or more gradient coils 9 which apply gradient magnetic fields across the static magnetic field. The scanner 6 includes a multi-channel coil 16 such as a whole body coil 12 and/or a multi-channel local coil 14. Examples of a multi-channel local coil include a 16 channel c-spine coil, a 32 channel cardiac coil, and the like. The scanner excites magnetic resonance in the subject, e.g. with the whole body coil. A sequence controller 18 controls a radio frequency (RF) controller 20 and a gradient controller 22. The RF controller 20 controls the application of radio frequency pulses used to excite magnetic resonance. The gradient controller 22 controls the gradient coils 9 which apply gradient fields during the imaging sequence.

As the magnetic resonance decays current is induced in each of the N coil elements 16 of the multi-channel coil 10. Each coil element of the multi-channel coil 10 can operate independently. Each of the coil elements transmits measurements of the induced current as one of N channels of MR data. Coil elements 16 are distributed about the coil and are spatially different due to the geometry of the coil. Each coil element or channel has different sensitivities. The different sensitivities are attributable to coil element hardware, spatial location/orientation, and the like. Coil elements are sensitive to motion which includes respiration, cardiac movement, swallowing, eye movement, pulsation, and the like.

The MR data from each channel of a plurality of channels is transmitted to an N channel radio frequency receiver 24, N single channel receivers or the like. The RF receiver 24 demodulates the MR data for each channel 25. N is a plural number typically greater than 2, such as 8, 16, 32, etc. Artifacts are detected and/or compensated on a channel by channel basis. The artifacts are detected on each channel by N detection units 26 from the data itself using consistency-based methods or from other information, such as a navigator sequence, patient monitors, such as cardiac or respiratory monitors, or the like.

Artifacted signal identification is performed on a channel by channel basis by N selection units 27. The selection units 27 reject data based on artifact content channel by channel. The selection units 27 select channels which include no or an acceptable level of detected artifacts. The selection unit can operate to reject channels which contain detected artifacts and include channels which are not rejected. Alternatively, a threshold amount can be established for which channels are selected at or below the threshold amount.

Each channel 25 can be filtered by filtering unit 28. The filters can filter the MR data of each channel using an algorithm to reduce artifacts such as COCOA, a frequency filter, a smoothing filter and the like. In some embodiments, the filter is adjustable such that filtering is varied in accordance with a degree of detected signal artifacting. Data consistency-based methods such as COCOA can be applied on a channel by channel basis to filter the MR data for each channel.

A substitution unit 30 can substitute synthetic data for data which includes detected artifacts on channels with detected artifacts. The substitute synthetic data can include data synthesized from data on other channels. Synthetic data can be produced using parallel imaging, compressed sensing, and the like.

The channels selected by the selection units 27, the filtered channels, and the channels with synthetic data are reconstructed into one or more images by the reconstruction unit 32. The image reconstruction, in some embodiments, is performed using parallel imaging techniques such as SENSE. The reconstructed images are displayed on a display 34 for the healthcare practitioner or stored in a storage device or storage system such as a Picture Archiving and Communication System (PACS), Radiology Information System (RIS), and the like.

The display 34 can be part of a workstation 36. The workstation 36 includes an electronic processor or electronic processing device 38, the display 34 which displays the images, menus, panels, and user controls, and at least one input device 40 which inputs the healthcare practitioner selections. The workstation 36 can be a desktop computer, a laptop, a tablet, a mobile computing device, a smartphone, and the like. The input device can be a keyboard, a mouse, a microphone, trackball, touchpad, pointing stick, graphics tablet, joystick, gamepad, webcam, headset, gear sticks, steering wheel, pedals, wired glove, dance pad, remote control, accelerometer, and the like.

The various units or modules 24, 26, 27, 28, 30, 32 are suitably embodied by one or more electronic data processing device(s), such as the electronic processor or electronic processing device 38 of the workstation 36, or by a network-based server computer operatively connected with the workstation 36 by a network, or so forth. Moreover, the disclosed artifact detection and compensation techniques are suitably implemented as a non-transitory storage medium storing instructions (e.g., software) readable by an electronic data processing device and executable by the electronic data processing device to perform the disclosed artifact detection and compensation techniques.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer-readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. References to a computer-readable storage medium should be interpreted as possibly being multiple computer-readable storage mediums. Various executable components of a program or programs may be stored in different locations. The computer-readable storage medium may for instance be multiple computer-readable storage medium within the same computer system. The computer-readable storage medium may also be computer-readable storage medium distributed amongst multiple computer systems or computing devices.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. The memory may also be multiple memories distributed amongst multiple computer systems or computing devices.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa. References to 'computer storage' or 'storage' should be interpreted as possibly being multiple storage. The storage may for instance be multiple storage devices within the same computer system or computing device. The storage may also be multiple storages distributed amongst multiple computer systems or computing devices.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

Figure 2:
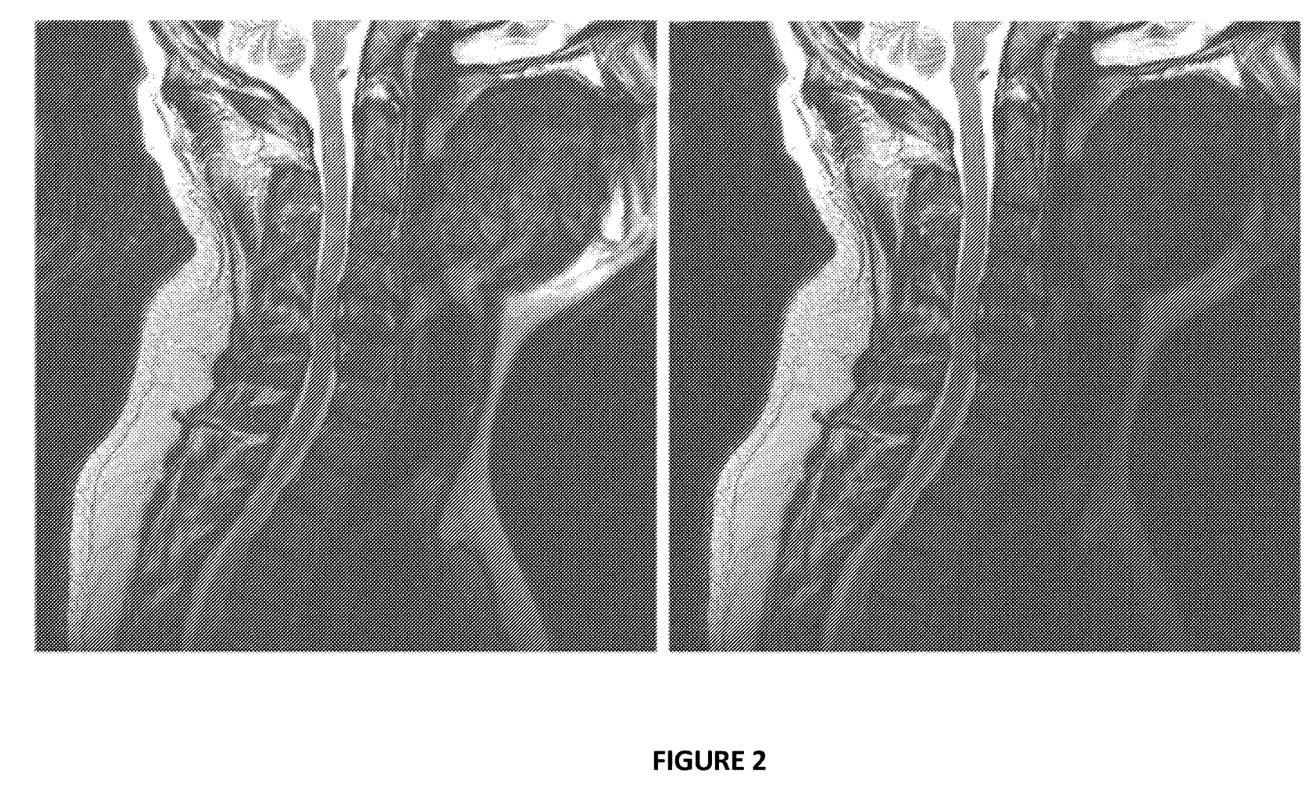
FIG. 2 depicts exemplary images with local motion.

With reference to FIG. 2, exemplary images with local motion are depicted. In the left side image, using a conventional system and methods, a reconstruction includes motion artifacts. The image is a sagittal view generated by a 16 channel c-spine coil. Swallowing motion generates artifacts in the image. Motion was detected on 3 channels by the detection unit 26. The selection unit 27 selects, for example, 13 of 16 possible channels which do not include the detected motion or are artifacted less than the threshold by the swallowing motion. The right side image was reconstructed by the reconstruction unit 32 with data from the selected 13 channels. The artifacts are not present in the right side image. The imaging sequence was not rerun. Rather the data was stored and the right side image was generated using the data from the 13 selected channels. Optionally, data from the 3 noisy channels could have been replaced with synthesized data, been filtered and retained, or the like. When the data is saved directly from the receivers, the operator can reconstruct images from data with selectable levels of artifacting in the data. For example, the operator can iteratively raise the levels of acceptable data corruption to increase signal to noise until unacceptable artifacting in the reconstructed image is detected.

Figure 3:
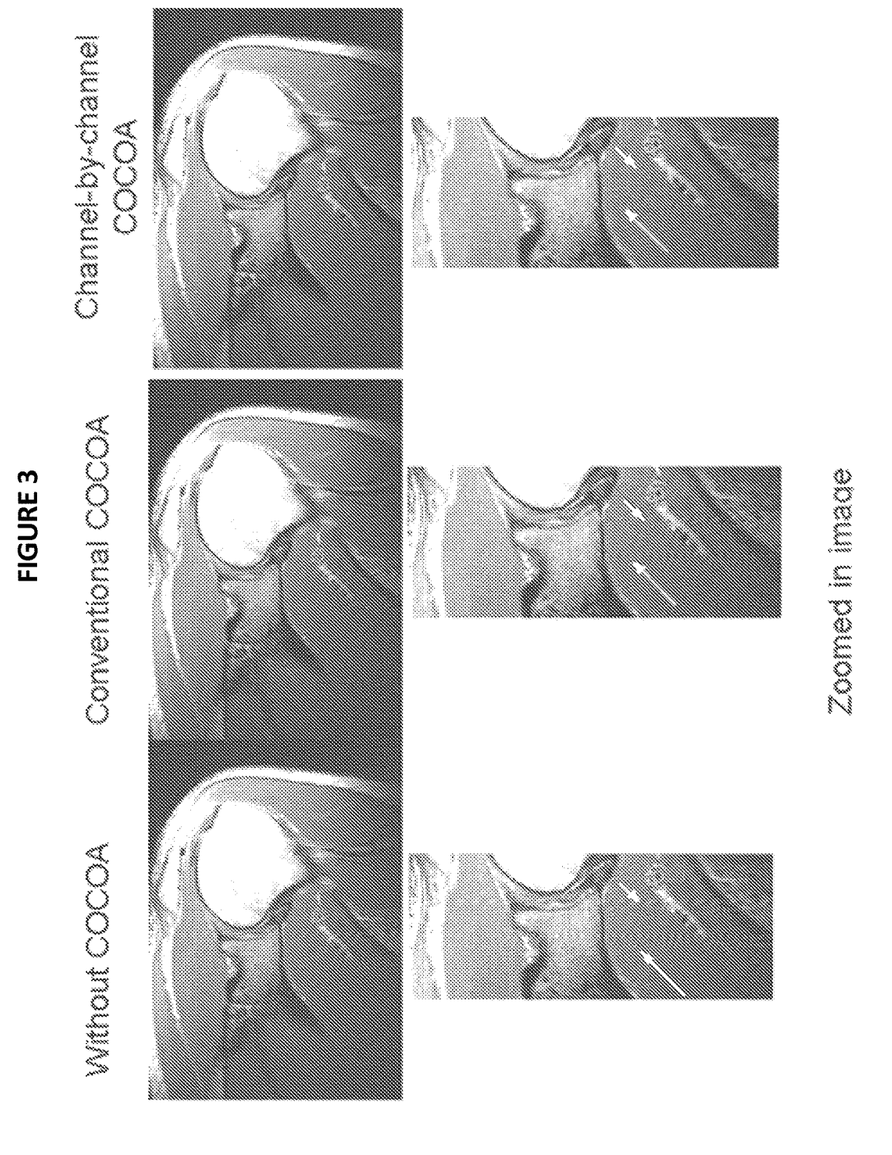
FIG. 3 depicts exemplary images with spike artifacts.

FIG. 3 depicts exemplary images with spike artifacts. Three images are shown, each with an exploded view showing an area which includes spike artifacts. In a first (left) image, using a conventional system and methods, the spike artifacts are evident highlighted by arrows. In a second (middle) image, conventional COCOA is applied to the MR data to filter the data. Although the spike artifact is reduced, the artifact is still present in the second image. Using the system 5, a third (right) image is constructed where the artifact is detected by channel, and the COCOA filter is applied to the channel MR data which include the artifact. The resulting third image is reconstructed from selected channels after the channels with the detected spike artifact are filtered with the COCOA algorithm. The spike artifact, which appears as regular tracks in the first two images, is not apparent in the last image.

The system detects spike or other unknown MR signal artifacts on each channel. By detecting MR signal artifacts such as spikes, artifacts due to coil element hardware functions are isolated and removed from the resulting image. Additionally, logs can be kept which report coil element artifacts. Repeated artifacts from a specific coil channel or coil element can be used as an indication for coil maintenance with regard to a particular coil element.

Figure 4:
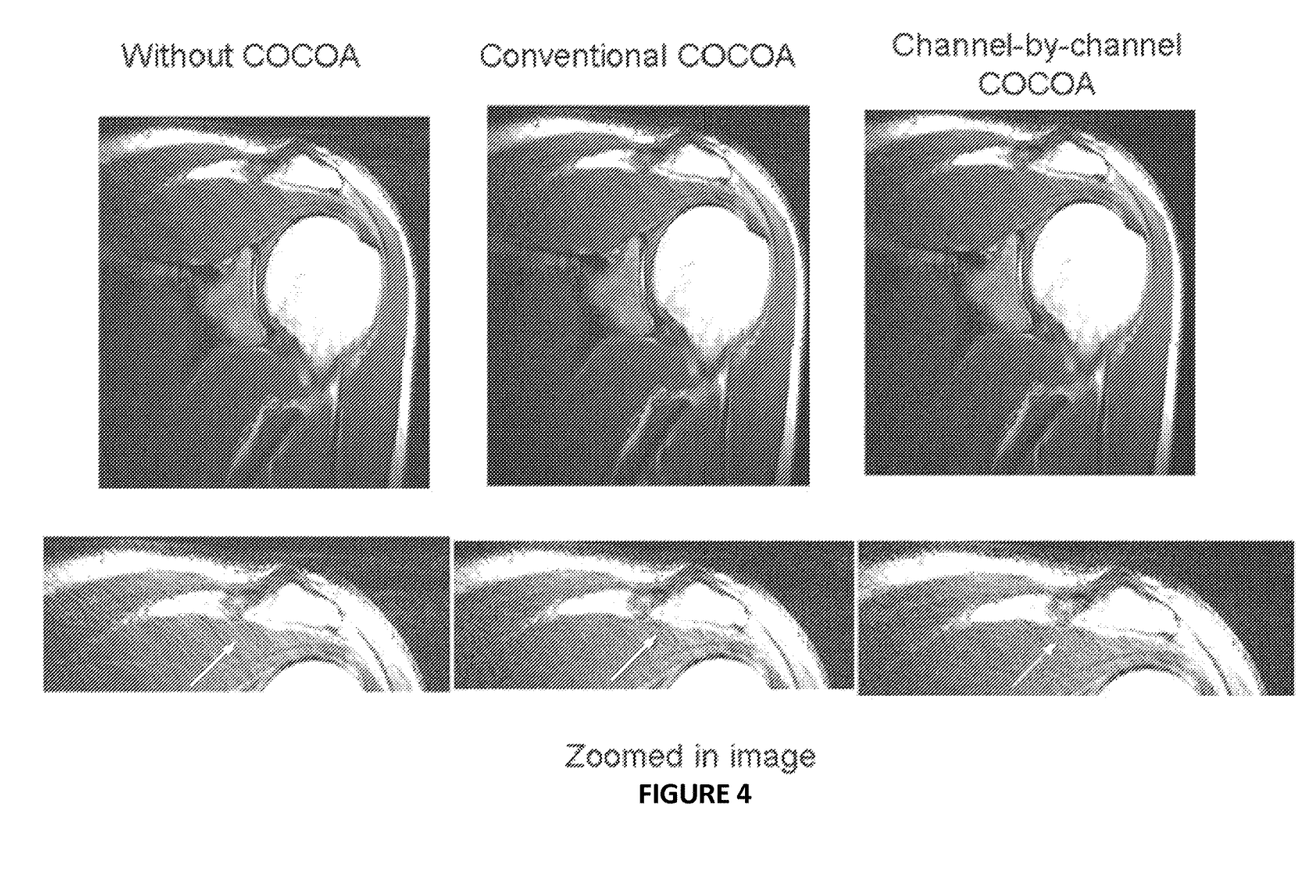
FIG. 4 depicts exemplary images with breathing artifacts.

FIG. 4 depicts exemplary images with breathing artifacts. Three images are presented, each with an exploded view to show image artifacts due to breathing or respiration movement. A first (left) image, reconstructed using a conventional system and methods, shows the image artifacts as striations in the image. A second (middle) image, filtering the MR data using COCOA reduces, but does not eliminate, the breathing artifacts. Using the system 5, in the third (right) image, the MR signal artifacts are detected channel by channel. The MR data on each channel is filtered using COCOA. The image is reconstructed from the selected channels. The striations due to breathing artifacts are almost entirely eliminated.

Figure 5:
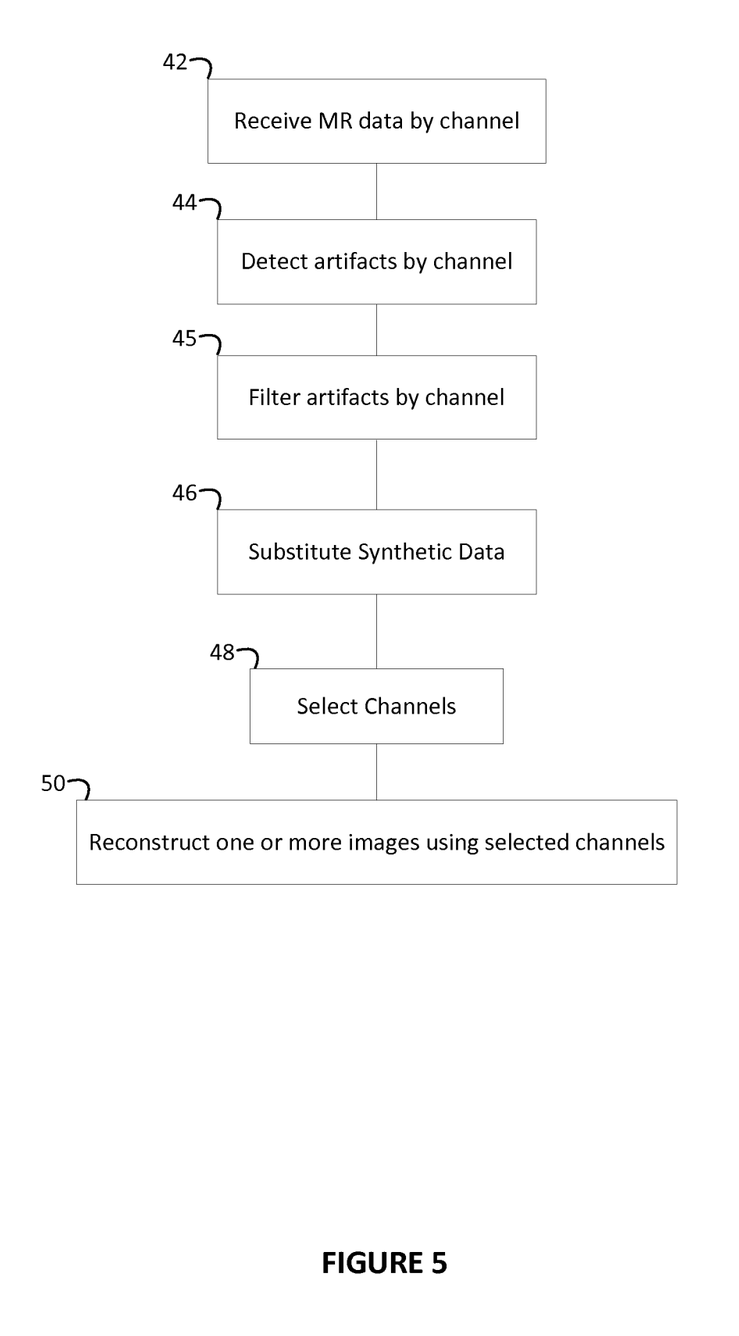
FIG. 5 flowcharts one method of channel by channel artifact reduction.

FIG. 5 flowcharts one method of channel by channel artifact reduction. In a first step 42, MR data is received channel by channel by the RF receiver 24. The detection unit 26 processes the MR data and detects signal artifacts and a degree of signal artifacting channel by channel in a step 44.

In an optional step 45, one or more filters are applied independently and in parallel each by channel to filter the MR data. The filters can be adjusted on each channel in accordance with a severity of the detected artifacts.

In an optional step 46, synthetic data can be substituted in channels where an artifact is detected. The synthetic data can be generated using reconstruction by partially parallel imaging, compressed sensing, and the like.

Channels are selected in a step 48 in which no or an acceptable level of signal artifacts are detected, filtered channels and/or channels with substituted synthetic data. Inclusion/exclusion is channel by channel. In a step 50, the reconstruction unit reconstructs one or more images from the MR data of the selected channels. The images can displayed on a display or display device. The images can stored in a storage management system such as a Picture Archiving and Communication System (PACS) or Radiology Information System (RIS).

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. An imaging system, comprising:
a plurality of receiver channels, each receiver channel configured to demodulate magnetic resonance data from a corresponding coil element of a multi-channel coil, the coil elements having differing sensitivities;
one or more processors or modules configured to:
individually detect artifacts in the demodulated magnetic resonance data from each receiver channel;
wherein the artifact detecting in the demodulated magnetic resonance data demodulated by one of the receiver channels is independent of the artifact detecting in the magnetic data demodulated by other receiver channels;
select the demodulated magnetic resonance data from the individual receiver channels which include detected artifacts at or below a selected level of detected artifacts; and
reconstruct one or more images using the selected demodulated magnetic resonance data.

2. The imaging system according to claim 1, wherein the one or more processors or modules are further configured to:
substitute synthetic data for demodulated magnetic resonance data which includes artifacts above the selected level of detected artifacts.

3. The imaging system according to claim 2, wherein the substitute synthetic data is generated by at least one of:
partially parallel imaging; and
compressed sensing.

4. The imaging system according to claim 1, further including:
a plurality of adjustable filters, each filter being configured to filter the magnetic resonance data from a corresponding one of the receiver channels, the filters being adjustable based on the detected artifacts.

5. The imaging system according to claim 1, wherein the artifact detection includes analysis of magnetic resonance data for consistency based on at least one of COCOA and Navigators.

6. The imaging system according to claim 1, further including:
a main magnet which generates a static magnetic field;
one or more gradient coils which apply gradient fields to the static magnetic field;
a coil which transmits radio frequency pulses to excite magnetic resonance in a region of tissue of a subject;
a controller in communication with the coil which controls the application of the radio frequency pulses used to excite magnetic resonance.

7. The imaging system according to claim 6, wherein the controller is configured to control the gradient coils and the radio frequency coils to apply a navigator sequence which detects motion on each channel.

8. The imaging system according to claim 1, further including:
a magnetic resonance multi-channel coil which includes the plurality of coil elements, each coil element of the plurality of coil elements being spatially localized and providing the magnetic resonance data in parallel and independently to the corresponding receiver channel.

9. The imaging system according to claim 1, wherein the one or more processors or modules are further configured to:
filter the demodulated magnetic resonance data from at least one receiver channel which includes detected magnetic resonance artifacts.

10. The imaging system according to claim 8, wherein the magnetic resonance multi-channel coil includes at least one of:
a 32 channel cardiac coil; and
a 16 channel spine coil.

11. A method of imaging, comprising:
demodulating magnetic resonance data from each coil element of a multi-channel coil with a corresponding receiver channel of one or more receivers;
individually detecting artifacts in the demodulated magnetic resonance data from each receiver channel;

selecting the demodulated magnetic resonance data from the receiver channels which include detected artifacts at below a selected level of detected artifacts; and reconstructing one or more images from the selected magnetic resonance data.

12. The method according to claim 11, further including:
substituting synthetic data in at least one of the channels of magnetic resonance data which includes detected artifacts above the selected level.

13. The method according to claim 11, further including:
filtering at least one channel in accordance with a level of the detected artifacts.

14. The method according to claim 11, wherein detecting includes:
detecting movement using an MR navigator sequence.

15. The method according to claim 11, wherein artifact detecting includes:
applying at least one algorithm which measures data consistency in the modulated magnetic resonance data from each receiver element.

16. The method according to claim 11, wherein the detected artifact includes at least one of:
spike artifacts;
pulsation artifacts;
breathing artifacts;
swallowing artifacts; and
cardiac motion artifacts.

17. The method according to claim 11, wherein the plurality of receiver channels includes at least 16 independent and parallel channels.

18. A non-transitory computer-readable storage medium carrying software which controls one or more electronic data processing devices to perform the method according to claim 11.

19. An electronic data processing device configured to perform the method according to claim 11.

20. An imaging system, comprising:
one or more processors configured to:
detect artifacts in the magnetic resonance data on each of a plurality of channels of a multi-channel coil, the magnetic resonance data on each channel being spatially localized;
select the magnetic resonance data from each channel in accordance with a relative level of artifacting; and
reconstruct one or more images using selected magnetic resonance data.

* * * * *